United States Patent [19]
Kaneko et al.

[11] Patent Number: 5,478,914
[45] Date of Patent: Dec. 26, 1995

[54] POLYIMIDES AND PROCESSES FOR PREPARAING THE SAME

[75] Inventors: Ichiro Kaneko; Atushi Sugitani; Masahiro Yuyama; Kiyoshi Motomi, all of Ibaraki, Japan

[73] Assignee: Shin-Etsu Chemical Co., Ltd., Tokyo, Japan

[21] Appl. No.: 266,341

[22] Filed: Jul. 1, 1994

[30] Foreign Application Priority Data

Jul. 16, 1993 [JP] Japan .................................. 5-199245
Aug. 23, 1993 [JP] Japan .................................. 5-229499

[51] Int. Cl.$^6$ .......................... C08G 73/10; C08G 69/26
[52] U.S. Cl. ...................... 528/353; 528/125; 528/128; 528/170; 528/172; 528/173; 528/179; 528/183; 528/185; 528/188; 528/220; 528/229; 528/310; 528/350
[58] Field of Search .................................. 528/310, 170, 528/353, 185, 172, 173, 179, 183, 188, 350, 220, 229, 125, 128

[56] References Cited

U.S. PATENT DOCUMENTS 4,980,447  12/1990  Khanna .................................. 528/353

*Primary Examiner*—P. Hampton-Hightower
*Attorney, Agent, or Firm*—Birch, Stewart, Kolasch & Birch

[57] ABSTRACT

Polyimides comprising recurring units of the following general formula (1)

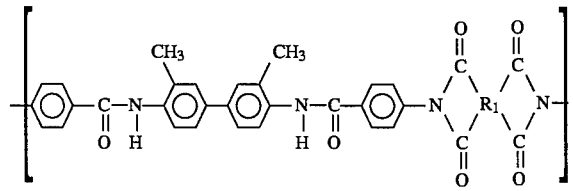

(1)

wherein $R_1$ represents a tetravalent aromatic group. Polyimide copolymers and preparations of the polyimides and the polyimide copolymers are also described.

22 Claims, No Drawings

POLYIMIDES AND PROCESSES FOR PREPARAING THE SAME

BACKGROUND OF THE INVENTION

1. Field of the Invention

This invention relates to novel polyimides which exhibit a good heat resistance, high mechanical strength and a low coefficient of linear expansion and are thus adapted for use as substrates such as finely patternized flexible printed board substrates. The invention also relates to processes for preparing such polyimides as mentioned above.

2. Description of the Prior Art

It is known in the art that polyimide resins have very good resistances to heat and chemicals and very good electric and mechanical characteristic properties along with other good characteristics.

A typical polyimide is one, for example, set forth in Japanese Patent Publication No. 36-10999, which is obtained from 4,4'-diaminodiphenyl ether and pyromellitic dianhydride. This polyimide has flexing ether bonds in the main chain thereof and is thus flexible irrespective of the fact that it consists of a totally aromatic polyimide. In contrast, the polyimide is low in elastic modulus, undesirably great in coefficient of linear expansion and poor in dimensional stability.

In recent years, however, there is a demand for the development of polyimide resins which have better thermal dimensional stability along with good mechanical strength in the fields such as of finely patternized flexible printed boards. Currently employed polyimide resins exhibit a coefficient of linear expansion undesirably as large as about $3 \times 10^{-5}/°C.$, with the attendant problem that the thermal dimensional stability is so poor that when laminated with metal sheets, they are apt to warp or curl.

On the other hand, there is an increasing demand for the development of polyimide resins which have better thermal dimensional stability and good mechanical strength. In order to meet the demand, extensive studies have now been made. In fact, many attempts have been made to use two or more aromatic diamines so as to improve the mechanical strength and thermal dimensional stability. However, in any of these attempts, it has not been possible to satisfy both requirements for the thermal dimensional stability and mechanical characteristics of polyimide resins.

SUMMARY OF THE INVENTION

It is accordingly an object of the invention to provide a polyimide resin which is high in heat resistance and excellent in mechanical strength and thermal dimensional stability and also to provide an industrially advantageous process for preparing such a polyimide resin.

In order to attain the above object, we made intensive studies and, as a result, found that an aromatic diamine and an aromatic acid dianhydride are reacted in a solvent to obtain a polyamido acid and the thus obtained polyamido acid is dehydrated to obtain a polyimide, wherein when using 4,4'-bis(4-aminobenzamido)-3,3'-dimethylbiphenyl of the following formula (3) as the starting aromatic diamine and a compound of the following formula (4) as the aromatic acid dianhydride, the polyimide obtained has recurring units of the following general formula (1). This polyimide has been found to have a high heat resistance and a low coefficient of linear expansion, so that good thermal dimensional stability is ensured along with good mechanical strength.

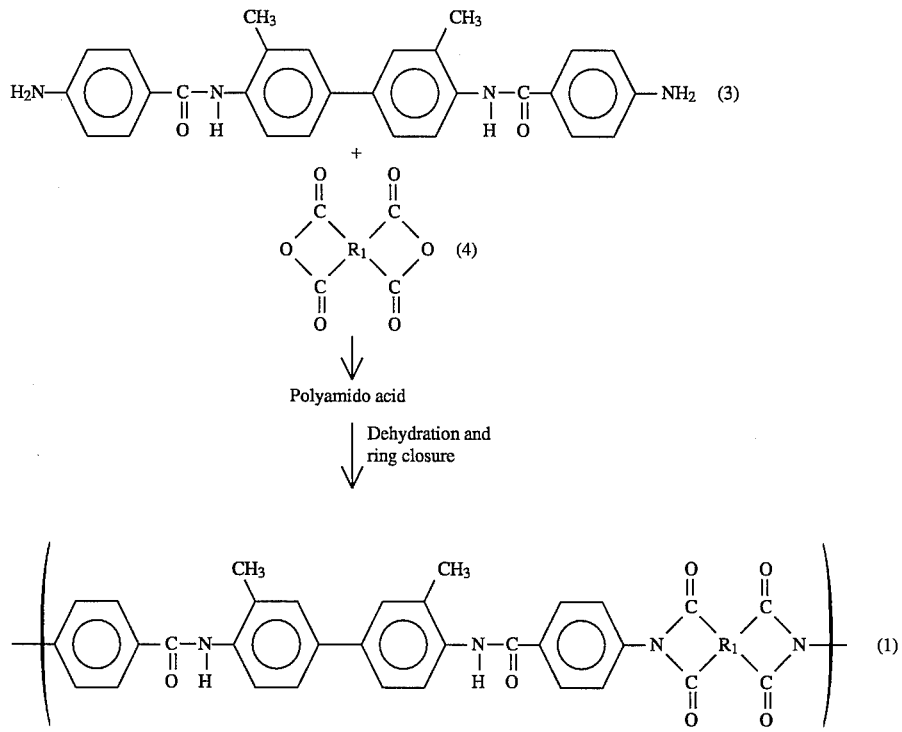

wherein $R_1$ represents a tetravalent aromatic group.

It has also been found that when an aromatic diamine which comprises, as its main component, a combination of 4,4'-bis(4-aminobenzamido)-3,3'-dimethylbiphenyl of the formula (3) and 4,4'-diaminodiphenyl ether and a tetracarboxylic acid dianhydride of the formula (4) are polymerized and the resultant polyamido acid copolymer is thermally or chemically dehydrated and ring-closed, there can be obtained a polyimide copolymer having both recurring units (A) of the following general formula (1) and recurring units (B) of the following general formula (2), preferably, at a molar ratio between the recurring units (A) and (B) of 5:95 to 90:10.

According to a further embodiment of the invention, there is also provided a process for preparing the above-defined polyimide copolymer which comprises polymerizing an aromatic diamine mainly composed of 4,4'-bis(4-aminobenz-amido)-3,3'-dimethylbiphenyl or its combination with 4,4'-diaminodiphenyl ether and an aromatic tetracarboxylic acid dianhydride to obtain a polyamido acid, and subjecting the polyamido acid to thermal or chemical dehydration and ring closure reaction.

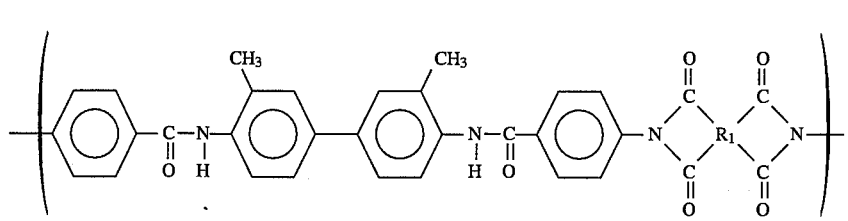

(1)

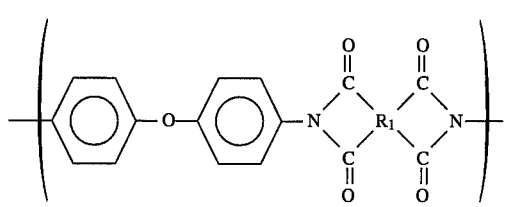

(2)

In the formulas, $R_1$ has the same meaning as defined above. The polyimide copolymer has good mechanical strength and a coefficient of linear expansion substantially equal to that of metals and a high modulus of elasticity. The invention is accomplished based on the above findings.

More particularly, according to one embodiment of the invention, there is provided a polyimide which comprises main recurring units of the above-said general formula (1).

According to another embodiment of the invention, there is also provided a polyimide copolymer which comprises both recurring units (A) of the above-said general formula (1) and recurring units (B) of the above-said general formula (2), preferably at a molar ratio of the recurring units (A) and (B) of 5:95 to 90:10.

DETAILED DESCRIPTION OF THE INVENTION

The polyimide of the invention is one which comprises main recurring units of the following general formula (1)

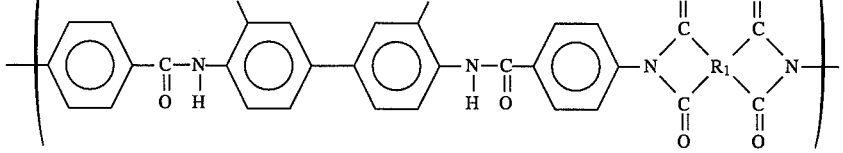

(1)

In the formula, $R_1$ represents a tetravalent aromatic hydrocarbon group which is derived from the aromatic group of aromatic tetracarboxylic acid dianhydrides described hereinafter. Such tetravalent aromatic hydrocarbon group include those indicated below.

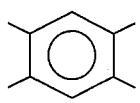

-continued

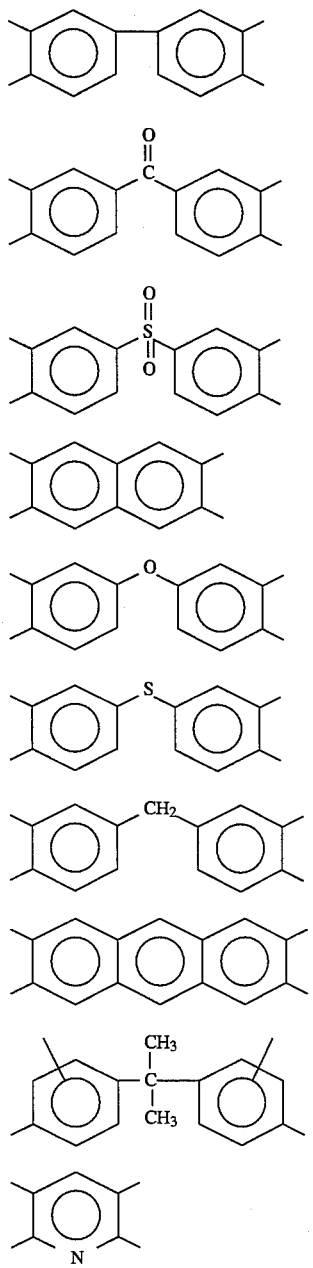

-continued

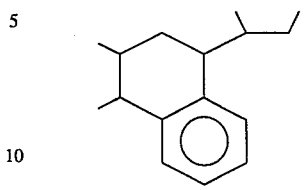

These tetravalent organic groups may be partly or wholly substituted, at the hydrogen atoms thereof, with a halogen atom, a nitro group, a cyano group, a carboxyl group, an amido group, an ester group, a carbonyl group, an alkoxy group or the like.

The polyimide of the invention may further contain not larger than 10 mole %, more preferably not larger than 5 mole %, of recurring units other than those units defined above, which are derived from the reaction product of polyvalent amine such as a diamine compound of the formula (5) described later.

The degree of polymerization of the polyimide of the invention is not critical. For instance, it is preferred that when using a polyamido acid at a concentration of 0.5 g/100 ml of dimethylformamide (DMF), a logarithmic viscosity at a measuring temperature of 30° C. is in the range of 0.5 to 5.

The polyimide copolymer of the invention should consist essentially of recurring units (A) of the following general formula (1) and recurring units of the following general formula (2)

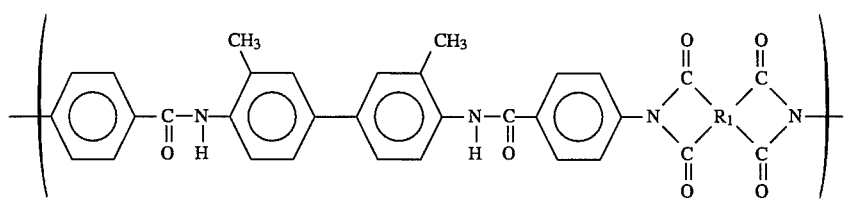

(1)

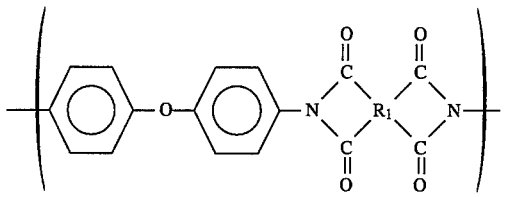

wherein $R_1$ has the same meaning as defined above.

The recurring units (A) and the recurring units (B) should preferably be present in the polyimide copolymer at a molar ratio of 5:95 to 90:10, more preferably 10:90 to 40:60. When the molar ratio of the recurring units (A) exceeds 90%, the resultant polyimide copolymer has a coefficient of linear expansion which is much smaller than that of metals and may low in flexibility. On the other hand, when the molar ratio of the recurring units (B) exceeds 95%, the resultant polyimide copolymer may not be improved satisfactorily with respect to the coefficient of linear expansion and modulus of elasticity.

The polyimide copolymer of the invention may further comprise, preferably in amounts not exceeding 10 mole %, more preferably not exceeding 5 mole %, recurring units which are derived from the reaction product of polyvalent amine such as a diamine compound of the formula (5) described hereinafter and an aromatic tetracarboxylic acid dianhydride.

The polyimide copolymer is a polymer which has a great molecular weight. When the viscosity of a polyamido acid is measured, for example, at a concentration of 0.5 g/100 ml of DMF, the logarithmic viscosity at a measuring temperature of 30° C. should preferably be within a range of 0.5 to 5.

The polyimide of the invention can be prepared by polymerizing an aromatic diamine and an aromatic tetracarboxylic acid dianhydride to obtain a polyamido acid, and subjecting the thus obtained polyamido acid to imidization, i.e. thermal or chemical dehydration and ring closure reaction.

In the case, the aromatic diamine used in the present invention is mainly composed of 4,4'-bis(4-aminobenzamido)-3,3'-dimethylbiphenyl of the following formula (3) or its combination with 4,4'-diaminodiphenyl ether. If used in combination, the molar ratio of 4,4'-bis(4-aminobenzamido)-3,3'-dimethylbiphenyl and 4,4'-diaminodiphenyl ether is 5:95 to 90:10, more preferably 10:90 to 40:60.

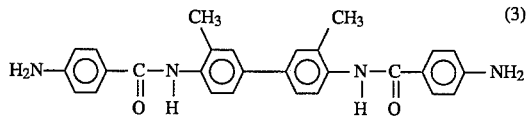

Although as set out above, it is most preferred to use, as the aromatic diamine ingredient, 4,4'-bis(4-aminobenzmido)-3,3'-dimethylbiphenyl alone or in combination with 4,4'-diaminodiphenyl ether, other diamine compounds of the general formula (5) may be used, if necessary.

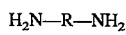

wherein R represents a divalent organic group.

Examples of such diamines include 4,4'-bis(4-aminophenoxy)biphenyl, 4,4'-diamino-diphenylsulfone, 3,3'-diaminodiphenylsulfone, bis[4-(4-aminophenoxy)phenyl]sulfone, bis[4-(3-aminophenoxy)phenyl]sulfone, bis[4-(2-aminophenoxy)phenyl] sulfone, 1,4-bis(4-aminophenoxy)benzene, 1,3-bis(4-amino-phenoxy)benzene, 1,3-bis(3-aminophenoxy)-benzene, 1,4-bis(4-aminophenyl)benzene, bis[4-(4-aminophenoxy)phenyl]ether, 4,4'-diaminodiphenylmethane, bis(3-methyl-4-aminophenyl)methane, bis(3-chloro-4-aminophenyl)methane, 3,3'-dimethoxy-4,4'-diaminodiphenyl, 3,3'-dimethyl-4,4'-diaminobiphenyl, 3,3'-dichloro-4,4'-diaminobiphenyl, 2,2',5,5'-tetrachloro-4,4'-diaminobiphenyl, 3,3'-dicarboxy-4,4'-diaminobiphenyl, 3,3'-dihydroxy-4,4'-diaminobiphenyl, 4,4'-diaminodiphenylsulfide, 3,3'-diaminodiphenyl ether, 4,4'-diaminodiphenyl ether, 3,4'-diaminodiphenyl ether, 4,4'-diaminodiphenylmethane, 4,4'-diaminobiphenyl, 4,4'-diaminooctafluorobiphenyl, 2,4-diaminotoluene, para-phenylenediamine, metaphenylenediamine, 4,4'-diaminobenzanilide, 3,4'-diaminobenzanilide, 4,3'-diaminobenzanilide, 2,2-bis[4-(4-aminophenoxy)-phenyl] propane, 2,2-bis[4-(4-aminophenoxy)-phenyl] hexafluoropropane, 2,2-bis(3-hydroxy- 4-aminophenyl)propane, 2,2-bis(3-hydroxy- 4-aminophenyl)hexafluoropropane, 9,9-bis(4-aminophenyl)- 10-hydro-anthracene, ortho-tolidine sulfone, and some tetraamines such as 3,3',4,4'-biphenyltetraamine and 3,3',4,4'-tetraaminodiphenyl ether. The polyvalent amines other than 4,4'-diaminodiphenyl ether and N,N'-4,4'-bis(4-aminobenzamido-3,3'-dimethylbiphenyl may be used in amounts within a range where the purpose and effect of the invention can be achieved. More particularly, it is appropriate to use such polyvalent amines in amounts not exceeding 10 mole %, preferably not exceeding 50 mole %, based on the total of the amines used.

The aromatic tetracarboxylic acid dianhydrides are those of the following formula (4) and include, for example, pyromellitic acid dianhydride, 3,3',4,4'- biphenyltetracarboxylic acid dianhydride, 2,3,3',4'-biphenyltetra -carboxylic acid dianhydride, 3,3',4,4'-benzophenonetetracarboxylic acid dianhydride, 2,3,6,7-naphthalenetetracarboxylic acid dianhydride, 1,4,5,8-naphthalenetetracarboxylic acid dianhydride, 2,2-bis(3,4-dicarboxy-phenyl)propane dianhydride, bis(3,4-dicarboxyphenyl)ethane dianhydride, bis(3,4-dicarboxyphenyl)ether dianhydride, 1,1-bis( 3,4-dicarboxyphenyl)ethane dianhydride, 3,4,9,10-perylenetetracarboxylic acid dianhydride, benzene -1,2,3,4-tetracarboxylic acid dianhydride, 2,3,6,7-anthracenetetracarboxylic acid dianhydride, 1,2,7,8-phenylenetetracarboxylic acid dianhydride and the like. These may be used singly or in combination.

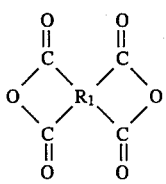

(4)

wherein $R_1$ has the same meaning as defined above.

In this case, the mixing ratio of the diamine and the acid dianhydride should preferably be within a range of 0.95 to 1.05 moles, preferably 0.98 to 1.02 moles, of the acid dianhydride per mole of the diamine. Outside the above range, the resultant polymer becomes low in molecular weight and satisfactory mechanical strength may not be obtained.

For the preparation of the aromatic diamine of the invention, the aromatic diamine and the aromatic tetracarboxylic acid dianhydride are mixed substantially at an equimolar ratio and are reacted in organic solvents to obtain a polyamido acid intermediate.

In the case, the solvents should be polar in nature. Examples of such organic polar solvents include sulfoxide solvents such as dimethylsulfoxide, diethylsulfoxide and the like, formamide solvents such as N,N-dimethylformamide, N,N-diethylformamide and the like, acetamide solvents such as N,N-dimethylacetamide, N,N-diethylacetamide and the like, pyrrolidone solvents such as N-methyl- 2-pyrrolidone, N-vinyl-2-pyrrolidone and the like, phenolic solvents such as phenol, o-, m- and p-cresol, xylenol, halogenated phenols, catechol and the like, hexamethylformamide, γ-butyrolactone, and the like. These may be used singly or in combination of two or more. Additionally, some aromatic hydrocarbons such as xylene, toluene and the like may likewise be used.

For the reaction, the starting materials should.preferably be used in an organic solvent in such amounts that the resultant polyamido acid is obtained as dissolved in an amount of 5 to 30 wt %, preferably 10 to 20 wt%, in the organic solvent. The reaction temperature is in the range of 0° to 70° C., preferably 0° to 30° C.

The polyimide of the invention can be obtained by subjecting the polyamido acid to thermal or chemical dehydration and ring -closure reaction by any known procedure.

The thermal dehydration and ring closure of the polyamido acid can be achieved by heating at 200° to 500° C. for 5 to 120 minutes.

For the chemical dehydration and ring closure reaction of the polyamido acid, dehydrators and catalysts are used. Examples of the dehydrators include aliphatic acid anhydrides, aromatic acid anhydrides, N,N-dialkylcarvone imides, lower fatty acid halides, halogenated lower fatty acid halides, halogenated lower fatty acid anhydrides, allyl phosphonic acid dehalides, thionyl halides and the like. These may be used singly or in combination.

The catalyst may be, for example, aliphatic tertiary amines such as triethylamine, aromatic tertiary amines such as dimethylaniline, heterocyclic tertiary amines such as pyridine, β-picoline, iso-quinoline and the like, and mixtures of two or more of these compounds.

Where a polyimide or polyimide copolymer film is obtained from the thus obtained polyamido acid, the solution of the polyamido acid is cast or coated on a support, such as an endless belt, in the form of a film. The film is dried at a temperature of 100° to 150° C. to obtain a self-supporting film of the polyamido acid containing 10 to 30% of the solvent. Subsequently, the film is peeled off from the support and fixed at end sides thereof, followed by heating at about 200° to 250° C. to completely remove the solvent therefrom. Thereafter, the film is heated to 300° to 500° C. whereupon the film is dehydrated and imidized to obtain a 10 to 150 μm thick polyimide film.

The thus obtained polyimide exhibits an excellent heat resistance, high mechanical strength and a coefficient of linear expansion substantially equal to that of metal. Thus, the polyimide is suited as an electric insulating material and a film material such as finely patternized flexible printed board substrates.

The present invention is more particularly described by way of Examples, which should not be construed as limiting the invention thereto. Comparative Examples are also shown.

Synthesis Example 4,4'-Bis(4-aminobenzamido)-3,3'-dimethylbiphenyl was prepared according to the following procedure.

37.1 g (0.175 moles) of 3,3'-dimethyl- 4,4'-diaminobiphenyl and 37.1 g (0.381 moles) of triethylamine were dissolved in 300 ml of tetrahydrofuran and cooled down to 0° C. Thereafter, a solution of 68.2 g (0.368 moles) of p-nitrobenzoyl chloride in 150 ml of tetrahydrofuran was dropped in the solution in such a way that the resultant reaction solution had a temperature not higher than 10° C. Subsequently, the reaction solution was returned to room temperature and was continued to agitate for 2 hours.

Subsequently, the resultant precipitate was filtered and washed with tetrahydrofuran, then with water and methanol, followed by drying to obtain yellowish white crystals of 4,4'-bis( 4-nitrobenzamido-3,3'-dimethylbiphenyl. The yield was 89.0 g (at a yield of 99.6%). The crude crystals were recrystallized from N,N'-dimethylformamide to obtain a pure product.

15.0 g (0.0294 moles) of the thus obtained 4,4'-bis(4-nitrobenzamido)-3,3'-dimethylbiphenyl was charged into a 1000 ml autoclave along with a 5% Cd on 3 g of C and 500 ml of dimethylformamide. While violently agitating at 60° C., hydrogen was introduced into the mixture, followed by continuation of agitation until any absorption of the hydrogen was not recognized.

After cooling, the catalyst was removed by filtration and the resultant residue was compressed under reduced pressure, followed by pouring into 500 ml of water. The settled precipitate was filtered and washed with water and then with methanol, followed by drying under reduced pressure to obtain yellow crystals of 4,4'-bis(4-aminobenzamido)-3,3'-dimethylbiphenyl. The yield was 13.2 g (at a yield of 99.6%). The crude crystals were recrystallized from a mixed solvent of dimethylformamide and methanol to obtain a pure product.

EXAMPLE 1

210.6 g of N,N'-dimethylformamide (DMF) was charged into a 500 ml flask. While passing a nitrogen gas, 15,769 g (0,035 moles) of 4,4'-bis( 4-aminobenzamido)-3,3'-dimethylbiphenyl was added, as an aromatic diamine, to the flask and dissolved in DMF. Thereafter, 7.634 g (0.035 moles) of pyromellitic dianhydride used as an aromatic acid dianhydride was added, followed by reaction at 25° C. for 3 hours.

The resultant polyamido acids was coated on a glass plate by means of an applicator and dried in a vacuum oven at 110° C. for 60 minutes, followed by peeling off and setting on an iron frame. Then the solvent was removed under conditions of 200° C. and 60 minutes and then 350° C. and 60 minutes, whereupon imidization took place, thereby obtaining an about 25 μm thick film.

The thus obtained film was subjected to measurements of mechanical characteristics (tensile strength, modulus of elasticity and elongation) according to ASTM D882-88. The coefficient of linear expansion was determined using a thermal analyzer TMA-7000 made by Shinku Riko K. K., under conditions of a heating rate of 5° C./minute and a temperature of 150° to 200° C. and was an average value of measurements.

EXAMPLE 2

234.6 g of DMF was charged into a 500 ml flask. While passing a nitrogen gas, 15,769 g (0.035 moles) of 4,4'-bis(4-aminobenzamido)- 3,3'-dimethylbiphenyl used as an aromatic diamine was dissolved in the DMF. Subsequently, 10.298 g (0,035 moles) of 3,3',4,4'-biphenyltetracarboxylic acid dianhydride was added, as an aromatic acid dianhydride, followed by reaction at 25° C. for 3 hours.

Thereafter, a polyimide film having a thickness of about 25 μm was obtained from the resultant polyamido acid solution in the same manner as in Example 1, followed by subjecting likewise to physical property tests.

EXAMPLE 3

243.4 g of DMF was charged into a 500 ml flask. While passing a nitrogen gas, 15.769 g (0.035 moles) of 4,4'-bis(4-aminobenzamido)- 3,3'-dimethylbiphenyl used as an aromatic diamine was dissolved in the DMF. Subsequently, 11.278 g (0,035 moles) of 3,3'4,4'-benzophenonetetracarboxylic acid dianhydride was added, as an aromatic acid dianhydride, followed by reaction at 25° C. for 3 hours.

Thereafter, an about 25 μm thick polyimide film was obtained from the resultant polyamido acid solution in the same manner as in Example 1, followed by subjecting likewise to physical property tests.

Comparative Example 1

445.0 g of DMF was charged into a 1000 ml flask. While passing a nitrogen gas, 20.024 g (0.010 moles) of 4,4'-diaminodiphenyl ether was dissolved in the DMF. Subsequently, 29,422 g (0.10 moles) of pyromellitic acid dianhydride was added, as an aromatic acid dianhydride, followed by reaction at 25° C. for 3 hours.

Thereafter, a polyimide film having a thickness of about 25 μm was obtained from the resultant polyamido acid solution in the same manner as in Example 1, followed by subjecting likewise to physical property tests.

Comparative Example 2

445.0 g of DMF was charged into a 1000 ml flask. While passing a nitrogen gas, 20.024 g (0.010 moles) of 4,4'-diaminodiphenyl ether was dissolved in the DMF. Subsequently, 29.422 g (0.10 moles) of 3,3',4,4'-biphenyltetracarboxylic acid dianhydride was added, as an aromatic acid dianhydride, followed by reaction at 25° C. for 3 hours.

Thereafter, a polyimide film having a thickness of about 25 μm was obtained from the resultant polyamido acid solution in the same manner as in Example 1, followed by subjecting likewise to physical property tests.

Comparative Example 3

470.2 g of DMF was charged into a 1000 ml flask. While passing a nitrogen gas, 20.024 g (0.010 moles) of 4,4'-diaminodiphenyl ether was dissolved in the DMF. Subsequently, 32.223 g (0.10 moles) of 3,3',4,4'-benzophenonetetracarboxylic acid dianhydride was added, as an aromatic acid dianhydride, followed by reaction at 25° C. for 3 hours.

Thereafter, a polyimide film having a thickness of about 25 μm was obtained from the resultant polyamido acid solution in the same manner as in Example 1, followed by subjecting likewise to physical property tests.

These results are shown in Table 1.

TABLE 1

| | Aromatic tetracarboxylic acid dianhydride | Aromatic diamine | Tensile strength (kgf/mm$^2$) | Tensile modulus of elasticity (kgf/mm$^2$) | Tensile elongation (%) | Coefficient of linear expansion (× 10$^{-6}$K$^{-1}$) |
|---|---|---|---|---|---|---|
| Example | | | | | | |
| 1 | Pyromellitic acid dianhydride | 4,4'-Bis(4-aminobenzamido)-3,3'-dimethylbiphenyl | 36.5 | 1974 | 11.4 | −0.09 |
| 2 | 3,3',4,4'-Biphenyltetracarboxylic acid dianhydride | 4,4'-Bis(4-aminobenzmido)-3,3'-dimethylbiphenyl | 35.4 | 1654 | 14.3 | 0.08 |
| 3 | 3,3',4,4'-Benzophenonetetracarboxylic acid dianhydride | 4,4'-Bis(4-aminobenzamido)-3,3'-dimethylbiphenyl | 37.0 | 1609 | 17.3 | 0.24 |
| Comparative Example | | | | | | |
| 1 | Pyromellitic acid dianhydride | 4,4'-Diaminodiphenyl ether | 18.5 | 490 | 53.6 | 2.75 |
| 2 | 3,3',4,4'-Biphenyltetracarboxylic acid dianhydride | 4,4'-Diaminodiphenyl ether | 15.9 | 601 | 35.2 | 3.79 |

TABLE 1-continued

| | Aromatic tetracarboxylic acid dianhydride | Aromatic diamine | Tensile strength (kgf/mm$^2$) | Tensile modulus of elasticity (kgf/mm$^2$) | Tensile elongation (%) | Coefficient of linear expansion ($\times 10^{-6}K^{-1}$) |
|---|---|---|---|---|---|---|
| 3 | 3,3',4,4'-Benzo-phenonetetracarboxylic acid dianhydride | 4,4'-Diaminodiphenyl ether | 14.3 | 591 | 44.6 | 5.03 |

As will be apparent from the results of Table 1, the polyimides of the invention have high mechanical strengths such as tensile strength, tensile modulus of elasticity and the like, and a coefficient of linear expansion which is smaller by one order of magnitude than that of known polyimides. It will be noted that the measuring procedures are as follows.

(1) Mechanical characteristics (tensile strength, tensile modulus of elasticity and elongation)

Determined according to the methods described in ASTM D882-88.

(2) Coefficient of linear expansion

An average value of measurements of a coefficient of linear expansion was determined using a thermal analyzer, TMA-7000, made by Shinku Riko K. K., under conditions of a heating rate of 5° C./minute and a temperature of 150° to 200° C.

EXAMPLES 4–6

In the same manner as in the foregoing example, there were obtained films using, as an aromatic diamine mixture, 4,4'-bis(4-aminobenzamido)- 3,3'-dimethylbiphenyl and 4,4'-diaminodiphenyl ether at different mixing ratios. The film characteristics are also shown in Table 2.

EXAMPLE 7

In the same manner as in the foregoing example, there was obtained a film using, as an aromatic diamine mixture, 4,4'-bis(4-aminobenzamido)- 3,3'-dimethylbiphenyl and 4,4'-diaminodiphenyl ether at a molar ratio of 1:1. The film characteristics are shown in Table 2.

The mechanical characteristics and the coefficient of linear expansion of the thus obtained filmed were determined in the same manner as in the foregoing examples. The results are shown in Table 2.

TABLE 2

| | Example | | | |
|---|---|---|---|---|
| | 4 | 5 | 6 | 7 |
| Pyromellitic acid dianhydride (g) | 20.44 | 20.44 | 20.44 | 0 |
| 3,3'4,4'-Biphenyltetracarboxylic acid dianhydride (g) | 0 | 0 | 0 | 10.30 |
| (I) 4,4'-Diaminodiphenyl ether (g) | 14.07 | 9.38 | 3.50 | 18.76 |
| (II) 4,4'-Bis(4-aminobenzamido)-3,3'-dimethyl-biphenyl (g) | 10.55 | 21.11 | 31.66 | 7.88 |
| (I)/(II) (molar ratio) | 75/25 | 50/50 | 25/75 | 50/50 |
| Tensile strength (kg/mm$^2$) | 23.3 | 27.3 | 32.4 | 27.0 |
| Tensile elongation (%) | 51 | 32 | 26 | 38 |
| Tensile modulus of elasticity (kgf/mm$^2$) | 850 | 1165 | 1557 | 982 |
| Coefficient of linear expansion ($\times 10^{-5}$/cm/°C.) | 1.51 | 0.63 | 0.35 | 0.80 |

What is claimed is:

1. A polyimide comprising main recurring units of the following general formula (1)

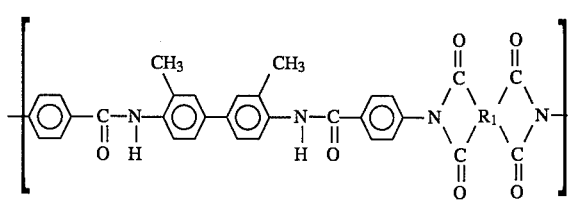

wherein $R_1$ represents a tetravalent aromatic group.

2. A process for preparing a polyimide defined in claim 1, which comprises polymerizing 4,4'-bis(4-aminobenzamido)-3,3'-dimethylbiphenyl and a tetracarboxylic acid dianhydride to obtain a polyamido acid, and subjecting the polyamido acid to thermal or chemical dehydration and ring closure reaction.

3. A polyimide copolymer consisting essentially of recurring units (A) of the following general formula (1) and recurring units (B) of the following general formula (2)

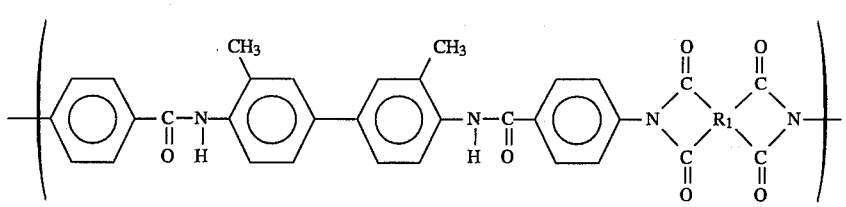

(1)

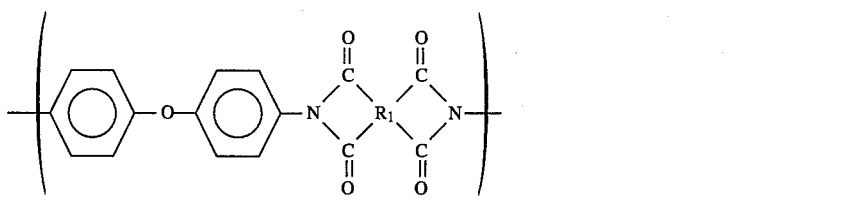

(2)

wherein each $R_1$ represents a tetravalent aromatic hydrocarbon group.

4. A polyimide copolymer according to claim 3, wherein a molar ratio between the recurring units (A) and the recurring units (B) is in the range of 5:95 to 90:10.

5. process for preparing a polyimide copolymer defined in claim 3, which comprises polymerizing an aromatic diamine comprising 4,4'-bis(4-aminobenzamido)-3,3'-dimethyl -biphenyl and 4,4'-diaminodiphenyl ether and a tetracarboxylic acid dianhydride to obtain a polyamido acid copolymer, and subjecting the polyamido acid copolymer to thermal or chemical dehydration and ring closure reaction.

6. The polyimide according to claim 1, wherein $R_1$ represents a tetravalent aromatic hydrocarbon group selected from the group consisting of

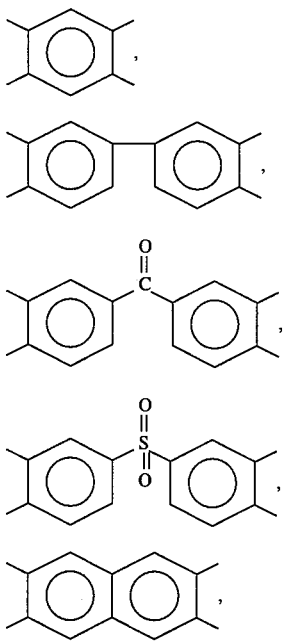

-continued

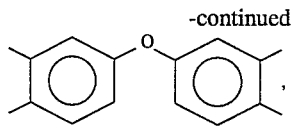

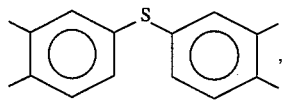

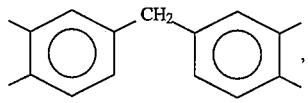

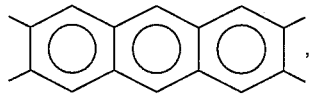

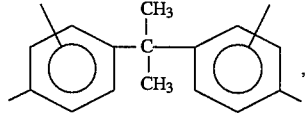

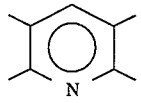

and

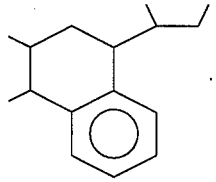

and that may be partly or wholly substituted with a halogen atom, a nitro group, a cyano group, a carboxyl group, an amido group, an ester group, a carboxyl group or an alkoxy group.

7. The polyimide copolymer according to claim 3, wherein $R_1$ represents a tetravalent aromatic hydrocarbon group selected from the group consisting of

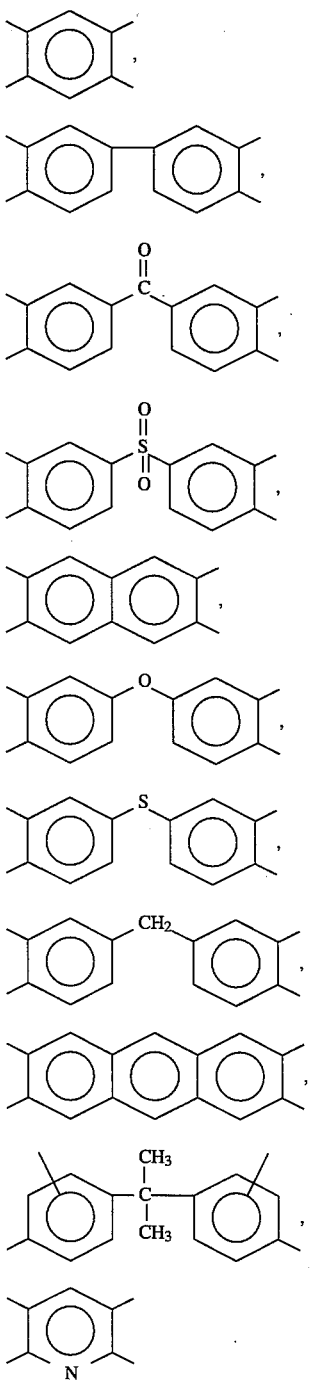

and

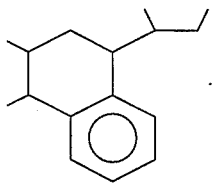

and that may be partly or wholly substituted with a halogen atom, a nitro group, a cyano group, a carboxyl group, an amido group, an ester group, a carboxyl group or an alkoxy group.

8. A polyimide copolymer according to claim 3, wherein a molar ratio between the recurring units (A) and the recurring units (B) is in the range of 10:90 to 40:60.

9. The process for preparing a polymide copolymer according to claim 5, wherein the molar ratio of 4,4'-bis(4-aminobenzamido) 3,3'-dimethylphenyl and 4,4'-diaminodiphenyl ether is 5:95 to 90:10.

10. The process for preparing a polymide copolymer according to claim 5, wherein the molar ratio of 4,4'-bis(4-aminobenzamido)- 3,3'-dimethylphenyl and 4,4'-diaminodiphenyl ether is 10:90 to 40:60.

11. The process for preparing a polyimide according to claim 2, which comprises polymerizing a diamine compound of the following formula $$H_2N-R-NH_2$$

wherein R represents a divalent organic group, the 4,4'-bis(4-aminobenzamido)-3,3'-dimethylbiphenyl, and the tetracarboxylic acid dianhydride to obtain a polyamido acid.

12. The process for preparing a polyimide copolymer according to claim 5, which comprises polymerizing a diamine compound of the following formula $$H_2N-R-NH_2$$

wherein R represents a divalent organic group, the 4,4'-bis(4-aminobenzamido)-3,3'-dimethyldiphenyl, the 4,4'-diaminodiphenyl ether, and the tetracarboxylic acid dianhydride to obtain a polyamido acid copolymer.

13. The process for preparing a polyimide according to claim 11, wherein the diamine compound is selected from the group consisting of 4,4'-bis(4-aminophenoxy)biphenyl, 4,4'-diaminodiphenylsulfone, 3,3'-diaminodiphenylsulfone, bis[4-(4-aminophenoxy)phenyl] sulfone, bis[4-(3-aminophenoxy)phenyl] sulfone, bis[4-(2-aminophenoxy)phenyl]sulfone, 1,4-bis(4-aminophenoxy) benzene, 1,3-bis(4-aminophenoxy)benzene, 1,3-bis(3-aminophenoxy)benzene, 1,4-bis(4-aminophenyl)benzene, bis [4-(4-aminophenoxy)phenyl] ether, 4,4'-diaminodiphenylmethane, bis(3-methyl- 4-aminophenyl)methane, bis(3-chloro-4-aminophenyl)methane, 3,3'-dimethoxy-4,4'-diaminodiphenyl, 3,3'-dimethyl-4,4'-diaminobiphenyl, 3,3'-dichloro-4,4'-diaminobiphenyl, 2,2',5,5'-tetrachloro- 4,4'-diaminobiphenyl, 3,3'-dicarboxy-4,4'-diaminobiphenyl, 3,3'-dihydroxy-4,4'-diaminobiphenyl, 4,4'-diaminodiphenylsulfide, 3,3'-diaminodiphenyl ether, 4,4'-diaminodiphenyl ether, 3,4'-diaminodiphenyl ether, 4,4'-diaminodiphenylmethane, 4,4'-diaminobiphenyl, 4,4'-diaminooctafluorobiphenyl, 2,4-diaminotoluene, paraphenylenediamine, meta-phenylenediamine, 4,4'-diaminobenzanilide, 3,4'-diaminobenzanilide, 4,3'-diaminobenzanilide, 2,2-bis [4-(4-aminophenoxy) phenyl]propane, 2,2-bis [4-(4-aminophenoxy)phenyl ]hexafluoropropane, 2,2-bis(3-hydroxy-4-aminophenyl) propane, 2,2-bis(3-hydroxy-4-aminophenyl) hexafluoropropane, 9,9-bis( 4-aminophenyl)-10-hydro-anthracene, ortho-tolidine sulfone, 3,3'4,4'-biphenyltetraamine and 3,3',4,4'-tetraaminodiphenyl ether.

14. The process for preparing a polyimide copolymer according to claim 12, wherein the diamine compound is selected from the group consisting of 4,4'-bis(4-aminophenoxy)biphenyl, 4,4'-diaminodiphenylsulfone, 3,3'-diaminodiphenylsulfone, bis[4-(4-aminophenoxy)phenyl] sulfone, bis[4-(3-aminophenoxy)phenyl]sulfone, bis[4-(2-aminophenoxy)phenyl]sulfone, 1,4-bis(4- aminophenoxy)benzene, 1,3-bis(4-aminophenoxy)benzene, 1,3-bis(3-aminophenoxy)benzene, 1,4-bis(4-aminophenyl)benzene, bis [4-(4-aminophenoxy) phenyl]ether, 4,4'-diaminodiphenylmethane, bis(3-methyl-4-aminophenyl)methane, bis(3-chloro-4-aminophenyl)methane, 3,3'-dimethoxy-4,4'-diaminodiphenyl, 3,3'-dimethyl-4,4'-diaminobiphenyl, 3,3'-dichloro-4,4'-diaminobiphenyl, 2,2',5,5'-tetrachloro- 4,4'-diaminobiphenyl, 3,3'-dicarboxy-4,4'-diaminobiphenyl, 3,3'-dihydroxy-4,4'-diaminobiphenyl, 4,4'-diaminodiphenylsulfide, 3,3'-diaminodiphenyl ether, 4,4'-diaminodiphenyl ether, 3,4'-diaminodiphenyl ether, 4,4'-diaminodiphenylmethane, 4,4'-diaminobiphenyl, 4,4'-diaminooctafluorobiphenyl, 2,4-diaminotoluene, paraphenylenediamine, meta-phenylenediamine, 4,4'-diaminobenzanilide, 3,4'-diaminobenzanilide, 4,3'-diaminobenzanilide, 2,2-bis [4-(4-aminophenoxy) phenyl]propane, 2,2-bis[4-(4-aminophenoxy)phenyl] hexafluoropropane, 2,2-bis(3-hydroxy-4-aminophenyl)propane, 2,2-bis(3-hydroxy-4-aminophenyl) hexafluoropropane, 9,9-bis(4-aminophenyl)-10-hydro-anthracene, ortho-tolidine sulfone, and some tetraamines such as 3,3',4,4'-biphenyltetraamine and 3,3',4,4'-tetraaminodiphenyl ether.

15. The process for preparing a polyimide according to claim 2, wherein the tetracarboxylic acid dianhydride is selected from the group consisting of pyromellitic acid dianhydride, 3,3',4,4'-biphenyltetracarboxylic acid dianhydride, 2,3,3',4'-biphenyltetracarboxylic acid dianhydride, 3,3',4,4'-benzophenonetetracarboxylic acid dianhydride, 2,3,6,7-naphthalenetetracarboxylic acid dianhydride, 1,4,5,8-naphthalenetetracarboxylic acid dianhydride, 2,2-bis(3,4-dicarboxyphenyl)propane dianhydride, bis(3,4-dicarboxyphenyl)ethane dianhydride, bis(3,4-dicarboxyphenyl)ether dianhydride, 1,1bis( 3,4-dicarboxyphenyl)ethane dianhydride, 3,4,9,10-perylenetetracarboxylic acid dianhydride, benzene-1,2,3,4-tetracarboxylicaciddianhydride, 2,3,6,7-anthracenetetracarboxylic acid dianhydride, and 1,2,7,8-phenylenetetracarboxylic acid dianhydride.

16. The process for preparing a polyimide copolymer according to claim 5, wherein the tetracarboxylic acid dianhydride is selected from the group consisting of pyromellitic acid dianhydride, 3,3',4,4'-biphenyltetracarboxylic acid dianhydride, 2,3,3',4'-biphenyltetracarboxylic acid dianhydride, 3,3',4,4'-benzophenonetetracarboxylic acid dianhydride, 2,3,6,7-naphthalenetetracarboxylic acid dianhydride, 1,4,5,8-naphthalenetetracarboxylicaciddianhydride, 2,2-bis(3,4-dicarboxyphenyl)propane dianhydride, bis(3,4-dicarboxyphenyl)ethane dianhydride, bis(3,4-dicarboxyphenyl)ether dianhydride, 1,1-bis( 3,4-dicarboxyphenyl)ethane dianhydride, 3,4,9,10-perylenetetracarboxylic acid dianhydride, benzene-1,2,3,4-tetracarboxylicaciddianhydride, 2,3,6,7-anthracenetetracarboxylic acid dianhydride, and 1,2,7,8-phenylenetetracarboxylic acid dianhydride.

17. The process for preparing a polyimide according to claim 11, wherein the mixing ratio of diamine to acid dianhydride is 0.95 to 1.05 moles acid dianhydride per mole diamine.

18. The process for preparing a polyimide copolymer according to claim 12, wherein the mixing ratio of diamine to acid dianhydride is 0.95 to 1.05 moles acid dianhydride per mole diamine.

19. The process for preparing a polyimide according to claim 11, wherein the diamine and tetracarboxylic acid dianhydride are reacted in one or more organic solvent selected from the group consisting of dimethylsulfoxide, diethylsulfoxide, N,N-dimethylformamide, N,N-diethylformamide, N,N-dimethylacetamide, N,N-diethylacetamide, N-methyl-2-pyrrolidone, N-vinyl-2-pyrrolidone, phenol, o-, m- and p-cresol, xylenol, halogenated phenols, catechol, hexamethylformamide, γ-butyrolactone, xylene and toluene.

20. The process for preparing a polyimide copolymer according to claim 12, wherein the diamine and tetracarboxylic acid dianhydride are reacted in one or more organic solvent selected from the group consisting of dimethylsulfoxide, diethylsulfoxide, N,N-dimethylformamide, N,N-diethylformamide, N,N-dimethylacetamide, N,N-diethylacetamide, N-methyl-2-pyrrolidone, N-vinyl-2-pyrrolidone, phenol, o-, m- and p-cresol, xylenol, halogenated phenols, catechol, hexamethylformamide, γ-butyrolactone, xylene and toluene.

21. The process for preparing a polyimide according to claim 11, wherein the diamine and acid dianhydride are mixed with a organic solvent in an amount such that the polyamido acid is dissolved in an amount of 5 to 30% by weight in the organic solvent.

22. The process for preparing a polyimide copolymer according to claim 12, wherein the diamine and acid dianhydride are mixed with a organic solvent in an amount such that the polyamido acid is dissolved in an amount of 5 to 30% by weight in the organic solvent.

\* \* \* \* \*